United States Patent
Lee et al.

(10) Patent No.: US 10,324,129 B2
(45) Date of Patent: Jun. 18, 2019

(54) INTEGRATED CIRCUIT AUTOMATIC TEST SYSTEM AND INTEGRATED CIRCUIT AUTOMATIC TEST METHOD STORING TEST DATA IN SCAN CHAINS

(71) Applicant: NATIONAL CHENG KUNG UNIVERSITY, Tainan (TW)

(72) Inventors: Kuen-Jong Lee, Tainan (TW); Ping-Hao Tang, Tainan (TW)

(73) Assignee: National Cheng Kung University, Tainan (TW)

( * ) Notice: Subject to any disclaimer, the term of this patent is extended or adjusted under 35 U.S.C. 154(b) by 97 days.

(21) Appl. No.: 15/479,632

(22) Filed: Apr. 5, 2017

(65) Prior Publication Data
US 2018/0038911 A1 Feb. 8, 2018

(30) Foreign Application Priority Data

Aug. 5, 2016 (TW) .............................. 105125063 A

(51) Int. Cl.
*G01R 31/3177* (2006.01)
*G01R 31/317* (2006.01)
*G01R 31/3185* (2006.01)

(52) U.S. Cl.
CPC ... *G01R 31/3177* (2013.01); *G01R 31/31723* (2013.01); *G01R 31/31724* (2013.01);
(Continued)

(58) Field of Classification Search
CPC ........ G01R 31/3177; G01R 31/318547; G01R 31/318536; G01R 31/31723; G01R 31/31724
See application file for complete search history.

(56) References Cited

U.S. PATENT DOCUMENTS

| 5,491,673 A | 2/1996 | Okayasu |
| 2008/0195346 A1* | 8/2008 | Lin ................ G01R 31/318575 |
| | | 702/119 |
| 2010/0135100 A1 | 6/2010 | Chiu |

FOREIGN PATENT DOCUMENTS

| TW | 201239377 A1 | 10/2012 |
| TW | 201418739 A | 5/2014 |

(Continued)

OTHER PUBLICATIONS

L. T. Wang et al., "VLSI Test Principles and Architectures: Design for Testability". Boston, MA, USA: Morgan Kaufmann, 2006. (Year: 2006).*

(Continued)

*Primary Examiner* — April Y Blair
*Assistant Examiner* — Rong Tang
(74) *Attorney, Agent, or Firm* — Rosenberg, Klein & Lee

(57) ABSTRACT

An integrated circuit (IC) automatic test system and an IC automatic test method storing test data in scan chains are revealed. The automatic test system includes at least one scan chain, a test controller and a test decompressor connected. Each scan chain consists of a storage portion with a plurality of scan units and a scan input corrector. The storage portion is for storing test data and the scan input corrector is used to adjust test patterns to be shifted into the scan chains. The test controller is for control of test flow while the test decompressor reconstructs and decompresses the test data stored in the storage portions of the scan chains to generate test patterns for the circuit under test. Thereby the IC electrical test is performed automatically and the test cost and the test cost is reduced.

9 Claims, 6 Drawing Sheets

(52) U.S. Cl.
CPC ........... *G01R 31/318536* (2013.01); *G01R 31/318547* (2013.01)

(56) References Cited

FOREIGN PATENT DOCUMENTS

| TW | 201433088 A | 8/2014 |
|----|-------------|--------|
| TW | I472778 B   | 2/2015 |

OTHER PUBLICATIONS

Kuen-Jong Lee, Pin-Hao Tang, Michael A. Kochte; An On-Chip Self-Test Architecture with Test Patterns Recorded in Scan Chains; Test Conference (ITC), 2016 IEEE International, Nov. 15-17, 2016, p. 1-3.

* cited by examiner

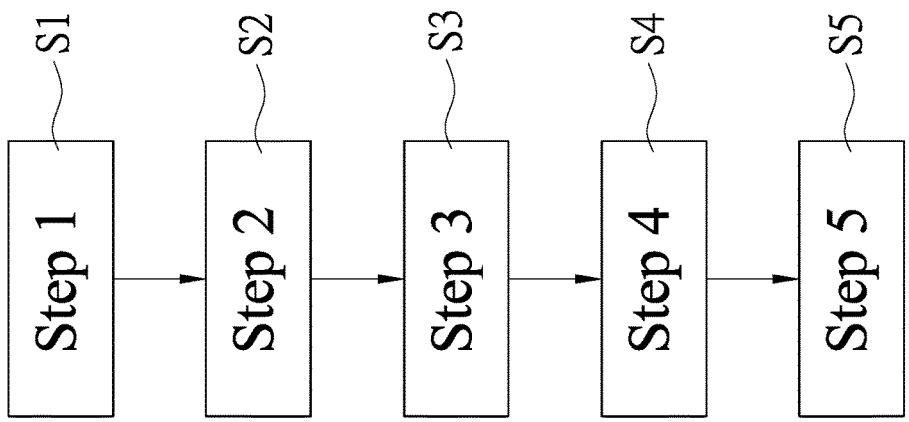

INTEGRATED CIRCUIT AUTOMATIC TEST SYSTEM AND INTEGRATED CIRCUIT AUTOMATIC TEST METHOD STORING TEST DATA IN SCAN CHAINS

BACKGROUND OF THE INVENTION

1. Field of the Invention

The present invention relates to an integrated circuit (IC) automatic test system and an IC automatic test method, especially to an IC automatic test system and an IC automatic test method storing test data in scan chains. The automatic test system is formed by at least one scan chain, a test controller, and a test decompressor. Test data is provided by different connections between two adjacent scan units of each scan chain. Then the test data is reconstructed and decompressed by the test decompressor to generate the test pattern required for tests and transfer the test pattern to the scan chains of the IC for performing electrical test. Thus the IC test system and the IC test method of the present invention perform automatic tests without using external automatic test equipment (ATE) to provide test data. Therefore test cost is significantly reduced.

2. Description of Related Art

Moore's Law is the observation that the number of transistors in an integrated circuit doubles approximately every 18 months along with advancements in semiconductor manufacturing technology. That means the performance is also doubled. Nowadays the number of the components in the integrated circuit is up to tens of millions or even hundreds of millions owing to fast development of semiconductor manufacturing technology. In order to perform electrical test of such huge and complicated circuits, a large amount of test data is required to complete the test and achieve the fault coverage required.

The conventional way used to test IC is by using external automatic test equipment (ATE) that sends test control signals and test patterns to IC through test pins. The test device applies test stimuli to the IC and receives test response from the IC owing to the test control signal. The test response is obtained and compared with the expected one by the ATE to complete IC electrical test. Such test way fully relies on the ATE so that the ATE becomes a major cost source. However, huge amount of test data and the increasing components result in higher requirements of storage space and test pins. Thus the ATE is getting more expensive and the test cost of IC is a great burden to semiconductor plants or packaging and testing plants.

Refer to Taiwanese Pub. Pat. No. TW 1472778 B, an automatic retest method for system-level IC test and IC test equipment using the same are revealed. A plurality of sets of test devices is used to run IC test respectively. After completing the IC test, test results are sent to a processor for being checked whether the respective test result is over a threshold set. If not, the IC is delivered into the test device with the highest pass rate again for retesting. Thus whether the IC is over the threshold after retest can be confirmed to avoid test errors and increase the yield rate.

The ATE still plays an important role on most of IC test methods available now. In order to reduce test cost generated owing to the automatic test equipment, test data compression and built-in-test (BIST) are proposed. Although these two methods can reduce the requirements of ATE for storage space and test pins, each of them has certain limits. The test data compression still needs external ATE to transfer some necessary test patterns or signals while the BIST has the shortcomings of longer test application time and additional storage space required for storing test data.

In order to overcome shortcomings of the conventional IC test device and the IC test method mentioned above, there is room for improvement and a need to provide a novel IC test device and an IC test method.

SUMMARY OF THE INVENTION

Therefore it is a primary object of the present invention to provide an integrated circuit (IC) automatic test system and an IC test method storing data in scan chains in which automatic test is achieved without using the external automatic test equipment to provide test patterns. The test cost is significantly reduced and the test time is also shortened. The IC automatic test system that stores test data in scan chains is an automatic test architecture formed by at least one scan chain, a test controller and a test decompressor connected. The test data required is generated by modified connections of the scan units of scan chains (connections between the scan units). Then the test data provided is reconstructed and decompressed by the test decompressor to generate the test pattern required for tests. The test pattern is transferred to the scan chains of the IC for performing electrical testing.

In order to achieve the above object, an integrated circuit (IC) automatic test system for storing test data in scan chains according to the present invention includes at least one scan chain, a test controller, and a test decompressor. Each scan chain consists of a storage portion and a scan input corrector. The storage portion includes a plurality of scan units. The scan unit is electrically connected to a test data input end of another scan unit by a true output end or a complementary output end thereof. The storage portion can output test data required after reset. The scan input corrector consists of two input ends and one output end. One of the input ends is electrically connected to an output end of the storage portion for receiving the test data from the output end of the storage portion. The other input end is electrically connected to an output end of the test decompressor while the output end is electrically connected to an input end of the storage portion. The test controller of the automatic test system is electrically connected to the scan chains and the test decompressor for control of test flow. As to the test decompressor, it is electrically connected to the test controller and the scan chains and used for reconstructing and decompressing test data from the storage portions of the scan chains into the test patterns the circuit under test requires.

After reset, one or more scan chains output at least one test data to be decompressed into the test pattern.

The test decompressor further includes a buffer. The test data output from the scan chains are stored temporarily in the buffer and are reassembled to generate a compressed test pattern.

In order to achieve the above object, an integrated circuit automated test method that stores test data in scan chains according to the present invention includes a plurality of steps. Step 1: Output a reset signal to scan chains by a test controller for resetting the storage portion of the scan chains. Step 2: Output a control signal by the test controller for shifting out at least one set of test data from the scan chains to get the test data able to be decompressed into a test pattern. Step 3: Receive the test data by a buffer of a test decompressor, and reconstruct the test data stored temporarily to generate a compressed test pattern. Step 4: Decompress the compressed test pattern by the test decompressor to generate the test pattern required by the scan chains, and send the test pattern to the scan chains for performing electrical test. Step 5: Repeat from step 1 to step 4 in turn repetitively until all test patterns have been sent to the scan chains and tested completely.

The storage portion of the scan chain includes a plurality of scan units. One scan unit is connected to a test data input end of another scan unit by a true output end or a complementary output end thereof.

The scan input corrector of the scan chain can be either an XOR gate or an XNOR gate.

The scan input corrector is used to adjust the pattern to be shifted into the scan chains so as to obtain the required test pattern.

After reset of the storage portion, the scan input corrector uses shift-out data from the storage portion to adjust test pattern from the decompressor. Thus the test pattern output from the scan input corrector to the scan units of the storage portion is equal to the test pattern output from the decompressor.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein:

FIG. 6 is a flow chart showing steps of an embodiment according to the present invention.

DETAILED DESCRIPTION OF THE PREFERRED EMBODIMENT

In order to learn functions and features of the present invention, please refer to the following embodiments and the related figures.

Figure 1:
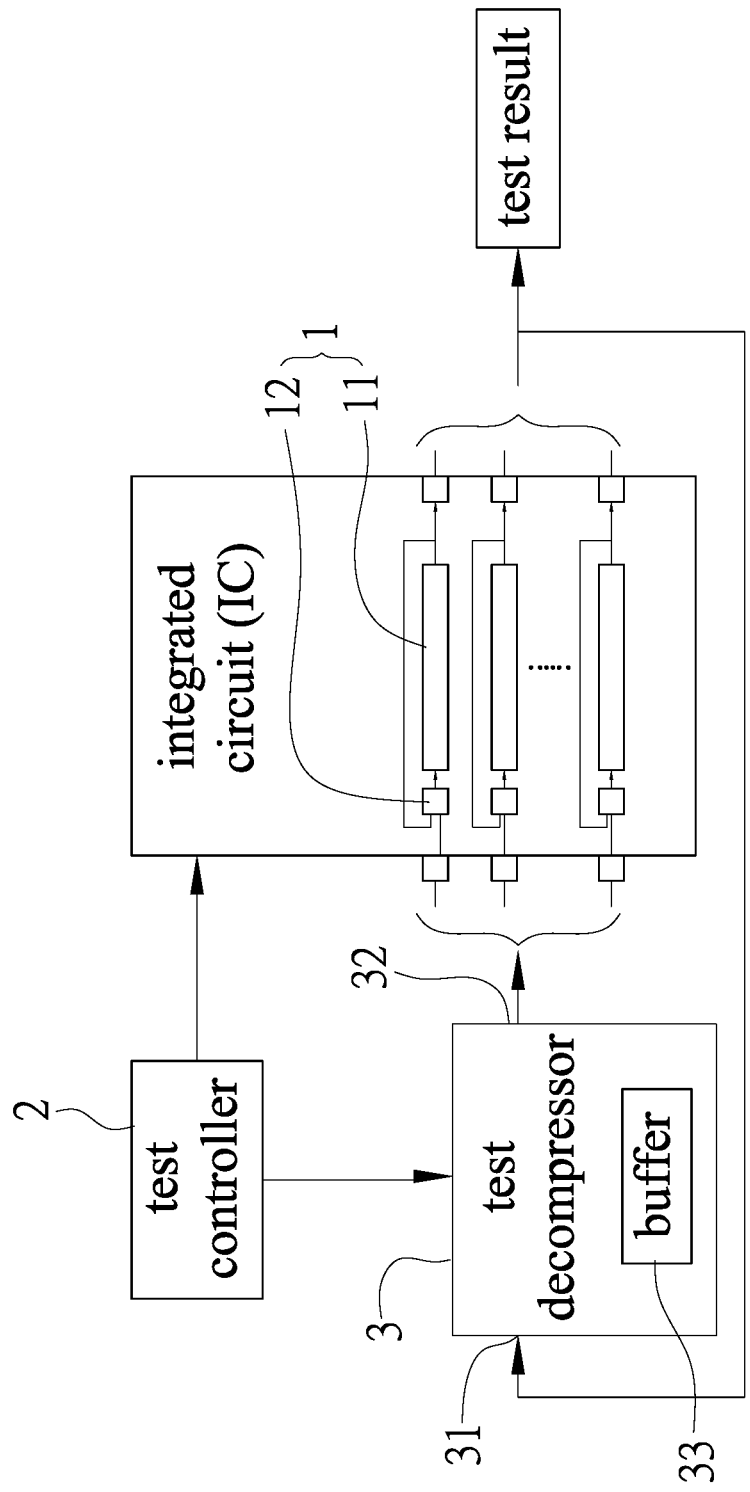
FIG. 1 is a schematic drawing showing structure of an embodiment according to the present invention.
Figure 2:
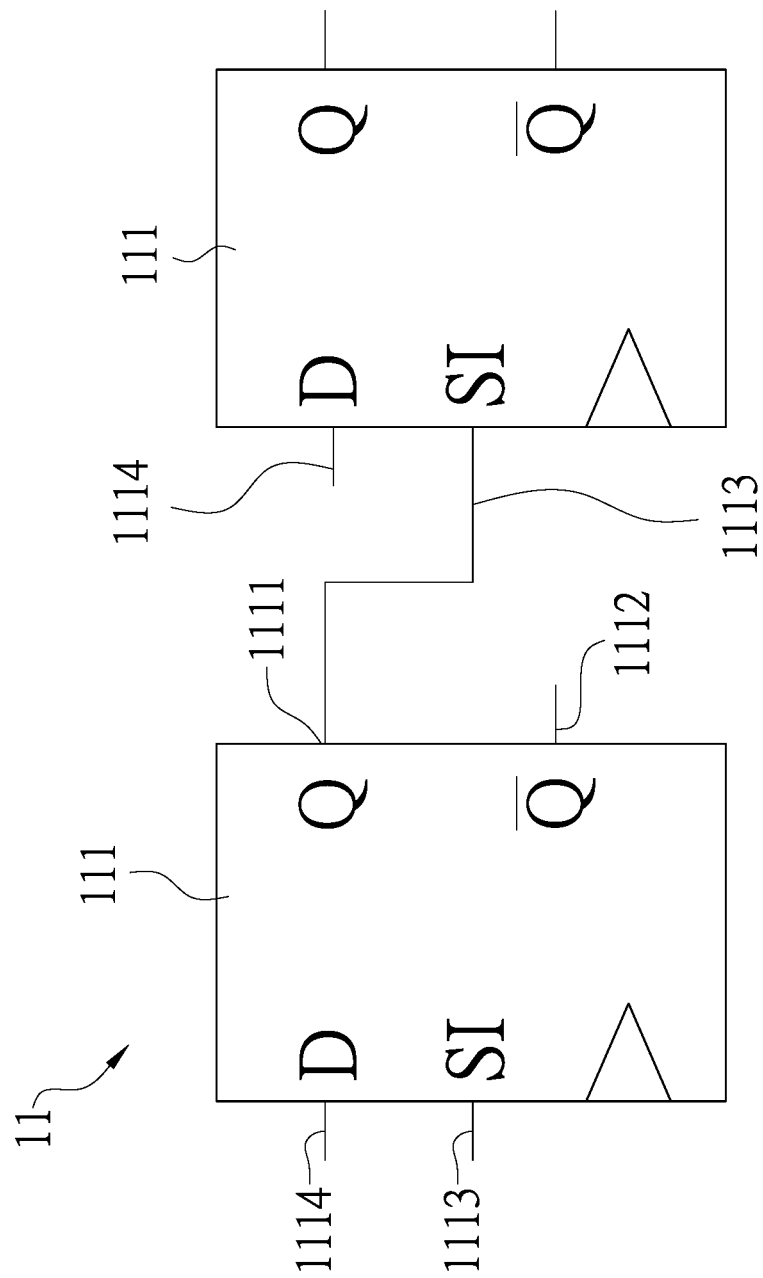
FIG. 2 is a schematic drawing showing connection of scan units of an embodiment according to the present invention.
Figure 3:
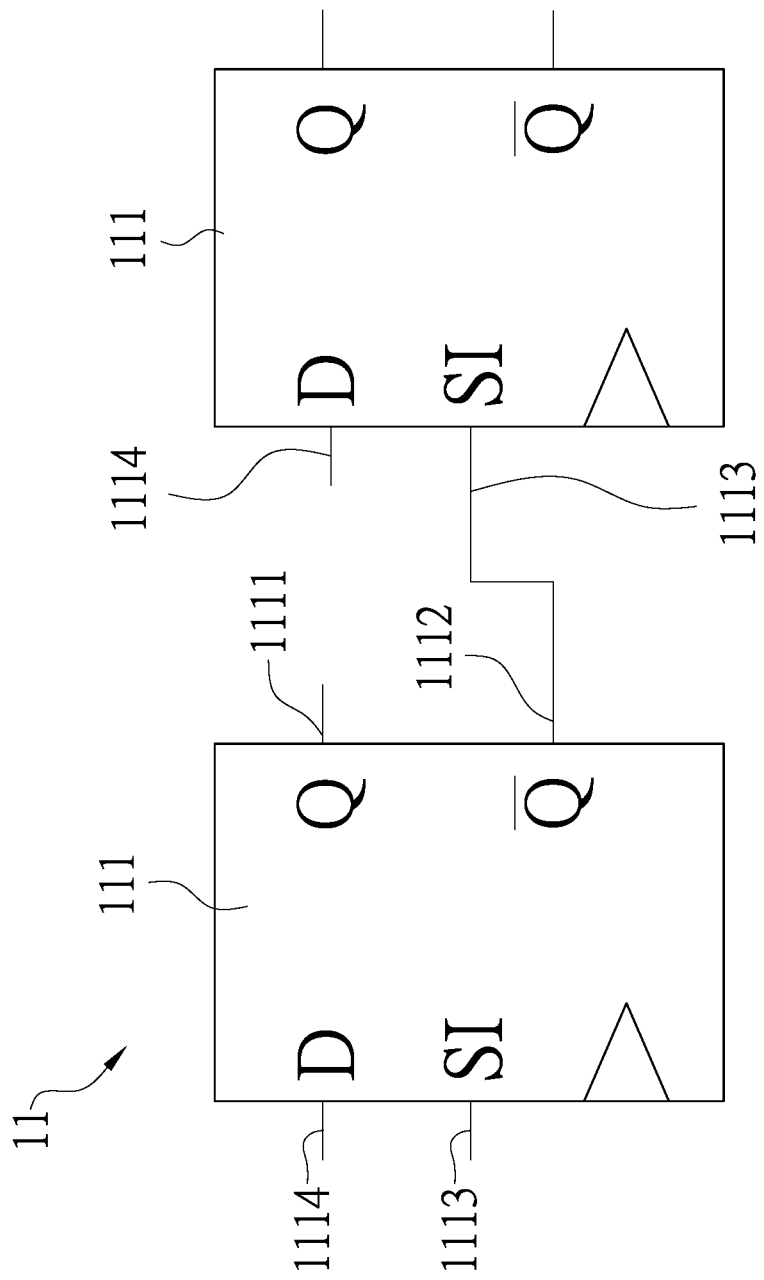
FIG. 3 is another schematic drawing showing connection of scan units of an embodiment according to the present invention.
Figure 4:
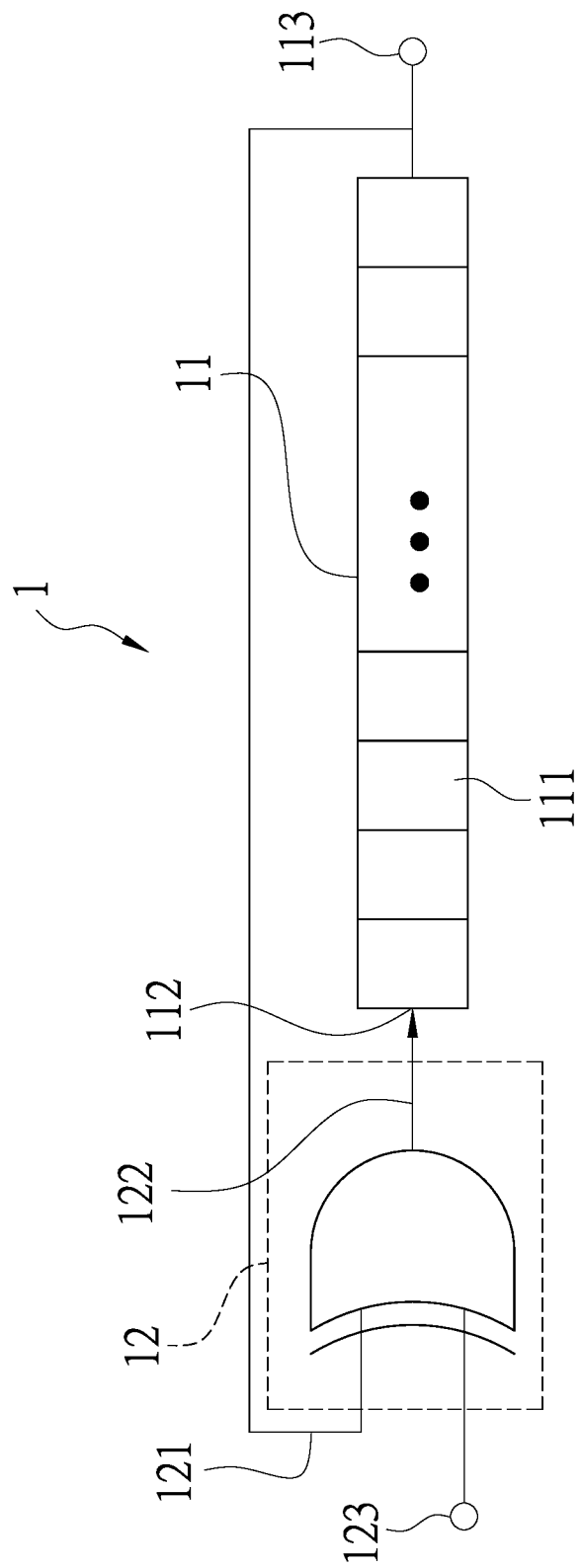
FIG. 4 is a schematic drawing showing connection of a scan input corrector to scan units of an embodiment according to the present invention.
Figure 5:
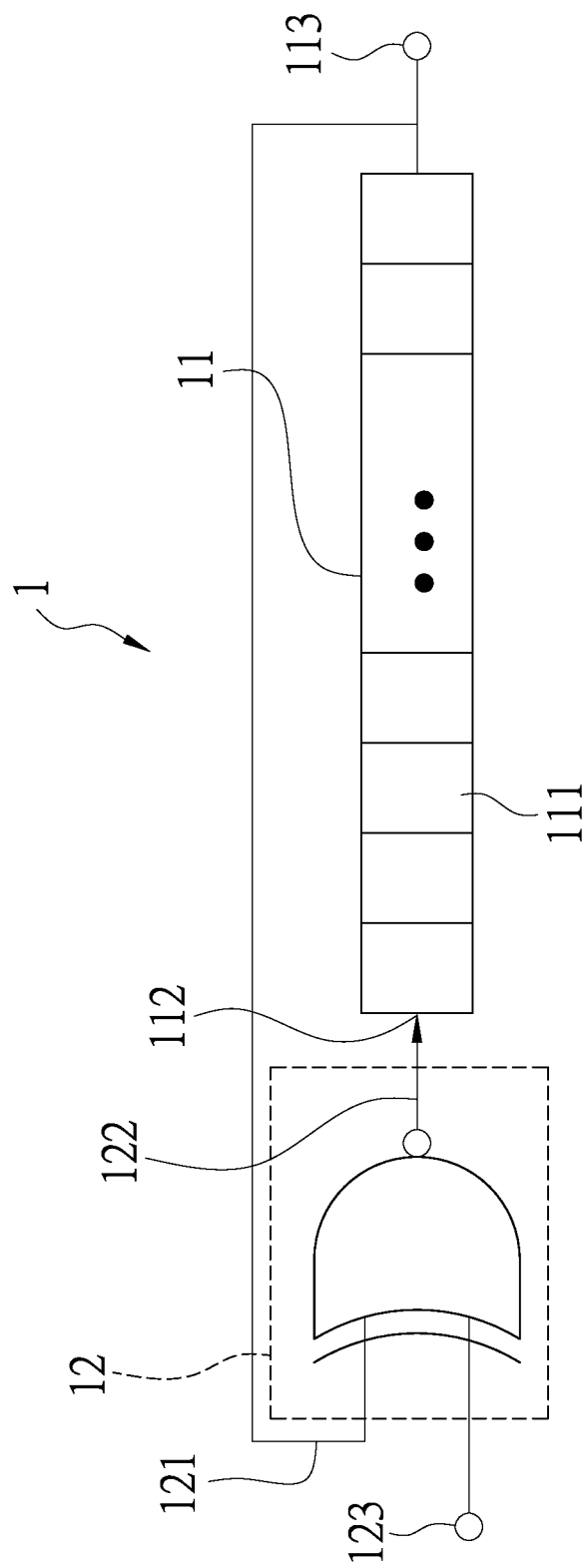
FIG. 5 is another schematic drawing showing connection of a scan input corrector to scan units of an embodiment according to the present invention.

Refer to FIG. 1, an integrated circuit (IC) automatic test system that stores test data in scan chains is revealed. The test system according to the present invention includes at least one scan chain 1, a test controller 2, and a test decompressor 3. The scan chain 1 outputs at least one test data after reset. Each scan chain 1 consists of a storage portion 11 and a scan input corrector 12. Refer to FIG. 2 and FIG. 3, the storage portion 11 includes a plurality of scan units 111 each of which is connected to a test data input end 1113 of another scan unit 111 by a true output end 1111 as shown in FIG. 2 or a complementary output end 1112 as shown in FIG. 3 thereof. Another input end of the scan unit 111 is a common input end of the circuit 1114 for normal circuit operation. Refer to FIG. 4 and FIG. 5, a first input end 121 of the scan input corrector 12 is electrically connected to and receiving from an output end 113 of the storage portion 11 while an output end 122 of the scan input corrector 12 is electrically connected to an input end 112 of the storage portion 11. The scan input corrector 12 can be an XOR gate as shown in FIG. 4 or an XNOR gate as shown in FIG. 5. The test controller 2 of the present test system is electrically connected to the scan chain 1 and the test decompressor 3 for control of test flow of integrated circuits. An input end of the test decompressor 3 is electrically connected to the output end of the storage portion 11 of the scan chain 1 while an output end 32 of the test decompressor 3 is electrically connected to a second input end 123 of the scan input corrector 12.

An integrated circuit automatic test method that stores test data in scan chains according to the present invention includes the following steps. Step 1 (S1): Output a reset signal to scan chains 1 by a test controller 2 for resetting the storage portion 11 of the scan chain 1. Step 2 (S2): Output a control signal by the test controller 2 for shifting out at least one set of test data from the storage portion 11 of one of the scan chains 1 to get the test data able to be decompressed into a test pattern. Step 3 (S3): Receive the test data by a buffer 33 of a test decompressor 3, and reconstruct the test data stored temporarily to generate a compressed test pattern. Step 4 (S4): Decompress the compressed test pattern by the test decompressor 3 to generate a test pattern required by the scan chains 1 and send the test pattern to the scan chains 1 for performing electrical test. Step 5 (S5): Repeat from step 1 (S1) to step 4 (S4) in turn repetitively until all test patterns have been sent to the scan chains 1 and applied to the CUT completely.

The scan input corrector 12 is used to adjust the pattern to be shifted to the scan units 111. After reset of the storage portion 11, the scan input corrector 12 adjusts the test pattern from the decompressor 3 by using shift-out data from the storage portion 11. Thus the test pattern output from the scan input corrector 12 to the scan units 111 of the storage portion 11 is equal to the test pattern output from the decompressor 3.

In order to learn applications of the present invention, please refer to the following embodiments.

As shown in FIG. 1, the test system according to the present invention is formed by at least one scan chain 1, the test controller 2, and the test decompressor 3 connected to one another. As shown in FIG. 2 and FIG. 3, the storage portion 11 of the scan chain 1 is formed by a plurality of scan units 111. Each scan unit 111 consists of two input ends and two output ends. The input ends are the test data input end 1113 and the common input end of the circuit 1114 while the output ends include the true output end 1111 and the complementary output end 1112. In order to generate the signal having the bit with the same value as that of the test data input end 1113, such as the test data 0→0 or 1→1, the true output end of the scan unit 111 is connected to the test data input end 1113 of another scan unit 111, as shown in FIG. 2. At the moment, the voltage level output from the scan unit 111 is the same as that of the data stored therein. Both are high-level or low-level. Refer to FIG. 3, in order to generate the signal having the bit with opposite value, the complementary output end of the scan unit 111 is connected to the test data input end 1113 of another scan unit 111. Thus the voltage level output is opposite to that of the data stored therein. Thereby the scan unit 111 can shift out different test data used in the following process including reconstruction, decompression, other actions, etc., according to the requirements of the voltage level and the signal. The storage portion 11 provides space for storing compressed test pattern therein.

Refer to FIG. 4 and FIG. 5, the scan input corrector 12 includes two input ends 121, 123 and one output end 122. The first input end 121 is electrically connected to the output end 113 of the storage portion 11 for receiving test data output from the storage portion 11 while the second input end 123 is electrically connected to the output end 32 of the test decompressor 3 for receiving test patterns output from the test decompressor 3. The output end 122 of the scan input corrector 12 is electrically connected to the input end 112 of the storage portion 11. The scan input corrector 12 is for adjustment of the shifted pattern received by the storage portion 11 and the shifted pattern is caused by the modified connections between two adjacent scan units 111. After reset of the storage portion 11, the scan input corrector 12 transfers the test pattern to the storage portion 11. The scan input corrector 12 adjusts the test pattern output from the decompressor 3 by using the shift-out data from the storage portion 11 to make the test pattern output from the scan input corrector 12 to the scan units 111 of the storage portion 11 equal to the test pattern output from the test decompressor 3 after resetting the storage portion 11. According to the number of the true or complementary output ends involved in the connections of the scan units 111 (odd or even), the scan input corrector 12 is selected from the group consisting of XOR gate and XNOR gate shown in FIG. 4 and FIG. 5. Moreover, the test controller 2 is electrically connected to both a plurality of scan chains 1 and the test decompressor 3, and able to output a plurality of control signals to both the scan chains 1 and the test decompressor 3 for control of test flow.

In practice, there is usually a plurality of scan chains 1 in the integrated circuit. The test controller 2 first sends a reset signal to the scan chains 1 so that the storage portion 11 is reset. Then a plurality of sets of test data is output to the scan input corrector 12 and the test decompressor 3. After receiving the test data, the buffer 33 of the decompressor 3 selects a part of the test data according to select signals from the test controller 2 and reconstructs the test data into data format that the decompressor 3 can use for generating a compressed test data. Moreover, the plurality of sets of test data is also transferred to the scan input corrector 12 while being transferred to the test decompressor 3 for adjustment and recovery of the test data. Then the test data is stored in the storage portion 11. Next the compressed test data is decompressed to generate a plurality of test patterns required by the scan chains 1. Each test pattern is transferred to the scan chains 1 through the scan input corrector 12 of each scan chain 1 for electrical test. A test result is generated after completing test of one test pattern and the rest test patterns are continuously transferred to the scan chains 1 until all the test patterns have been tested completely in the scan chains 1.

Thereby no external automated test equipment (ATE) that provides test patterns and signals is required for automated test. The test cost is significantly reduced and integrated circuits are tested automatically.

Compared with the techniques available now, the present invention has the following advantages:

1. The integrated circuit is tested automatically by the automatic test system including the scan chains, the test controller and the test decompressor. The external ATE used before can be replaced by the present invention. Thus the test cost is significantly reduced, the manufacturing efficiency is improved and the manufacturing cycle is shortened.

2. The scan chain includes the storage portion so that the compressed test pattern can be stored in the storage portion. No additional storage device or external equipment is required for providing storage space. Thus the shortcoming of the conventional test system that uses ATE for storage of test data/patterns can be overcome.

3. By loop connection of the input end and the output end thereof, the scan input corrector can adjust the pattern affected by modified connections of the scan units and received by the storage portion to make the test pattern shifted into the scan units equal to the test pattern output from the decompressor.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalent.

What is claimed is:

1. An integrated circuit automatic test system with storing test data in scan chains comprising:
    at least one scan chain, said at least one scan chain having a storage portion and a scan input corrector;
    a test controller electrically connected to the scan chain; and
    a test decompressor electrically connected to the test controller and the scan chain;
    wherein the storage portion of said at least one scan chain includes at least a first and a second scan units for storage of test data required, each of said at least first and second scan units having a respective test data unit end;
    wherein the at least first scan unit is electrically connected to said respective test data input end of the at least second scan unit by a true output end or a complementary output end thereof;
    wherein a first input end of the scan input corrector of said at least one scan chain is electrically connected to an output end of the storage portion thereof;
    wherein an output end of the scan input corrector of said at least one scan chain is electrically connected to an input end of the storage portion thereof; and
    wherein an input end of the test decompressor is electrically connected to the output end of the storage portion of said at least one scan chain, and an output end of the test decompressor is electrically connected to a second input end of the scan input corrector of said at least one scan chain; and
    wherein the scan input corrector adjusts a test pattern shifted from the decompressor by using shift-out test data from the storage portion after reset of the storage portion, a test pattern output from the scan input corrector to the scan units of the storage portion being equal to the test pattern shifted from the decompressor.

2. The system as claimed in claim 1, wherein the scan chains output at least one test data after reset.

3. The system as claimed in claim 1, wherein the test decompressor further includes a buffer used for temporary storage of test data from the scan chains and reconstruction of the test data to generate compressed test pattern.

4. The system as claimed in claim 1, wherein the scan input corrector is selected from a group consisting of an XOR gate and an XNOR gate.

5. The system as claimed in claim 1, wherein the scan input corrector is used to adjust a test pattern to be shifted into the scan chains.

6. An integrated circuit automated test method with storing test data in scan chains, comprising:
    configuring at least one scan chain with a storage portion and a scan input correction; and performing the steps of:

outputting a reset signal to at least one of a plurality of scan chains by a test controller for resetting the storage portion of at least one of a plurality of scan chains;

outputting a control signal by the test controller for shifting out at least one set of test data from the at least one scan chain to obtain the test data to be decompressed into a test pattern;

receiving the test data from said at least one scan chain by a buffer of a test decompressor, and reconstructing the received test data into a compressed test pattern;

decompressing the compressed test pattern by the test decompressor to generate the test pattern required by the at least one scan chain, and sending the test pattern to the at least one scan chain for performing electrical test;

repeating previous steps in turn repetitively until all the test patterns have been sent to said plurality of scan chains for completing an electrical test;

wherein a first input end of the scan input corrector of said at least one scan chain is electrically connected to an output end of the storage portion of said at least one scan chain;

wherein a second input end of the scan input corrector of said at least one scan chain is electrically connected to an output end of the test decompressor;

wherein an output end of the scan input corrector of said at least one scan chain is electrically connected to an input end of the storage portion, and wherein the scan input corrector of said at least one scan chain adjusts a test pattern shifted from the decompressor by using shift-out test data from the storage portion of said at least one scan chain after resetting said storage portion, thus bringing a test pattern output from the scan input corrector of said at least one scan chain to the storage portion of said at least one scan chain to be equal to the test pattern shifted from the decompressor.

7. The method as claimed in claim 6, wherein the storage portion of each scan chain includes a plurality of scan units, and wherein the scan unit is connected to a test data input end of another scan unit by a true output end or a complementary output end thereof.

8. The method as claimed in claim 6, wherein the scan input corrector is selected from the a group consisting of an XOR gate and an XNOR gate.

9. The method as claimed in claim 6, wherein the scan input corrector is used to adjust the test pattern to be shifted into the scan chains.

* * * * *